United States Patent [19]

Sunkler

[11] 4,010,428
[45] Mar. 1, 1977

[54] TRANSISTOR OSCILLATOR UTILIZING CLAPP CIRCUIT CONFIGURATION FOR OPERATION IN THE MICROWAVE BAND

[75] Inventor: Anton Sunkler, Munich, Germany

[73] Assignee: Siemens Aktiengesellschaft, Berlin & Munich, Germany

[22] Filed: Sept. 15, 1975

[21] Appl. No.: 613,515

[52] U.S. Cl. .................. 331/117 R; 331/117 D; 331/177 V; 332/30 V
[51] Int. Cl.² .................. H03B 5/24; H03C 3/22
[58] Field of Search ............ 331/117 R, 117 D, 99, 331/36 C, 167, 177 R, 177 V; 332/30 R, 30 V

[56] References Cited

UNITED STATES PATENTS

| | | | |
|---|---|---|---|
| 2,760,070 | 8/1956 | Keonjian | 331/117 R X |
| 3,400,338 | 9/1968 | Ishman | 331/36 C X |
| 3,679,990 | 7/1972 | Hiday et al. | 331/117 D X |
| 3,899,755 | 8/1975 | Uchida | 332/30 V |

*Primary Examiner*—Siegfried H. Grimm
*Attorney, Agent, or Firm*—Hill, Gross, Simpson, Van Santen, Steadman, Chiara & Simpson

[57] ABSTRACT

A transistor oscillator for the microwave band, utilizing CLAPP-circuit configuration, in which a small additional capacitance is connected in series with collector-base capacitance and is disposed between the base and ground. The additional capacitance may be in the form of a trimming capacitor, varactor elements or a line section having a length of less than λ/4, and where strip line technology is employed high frequency filter chokes may be employed in the form of line sections, each of a length of λ/4 whose ends are short circuited over blocking capacitors.

11 Claims, 12 Drawing Figures

TRANSISTOR OSCILLATOR UTILIZING CLAPP CIRCUIT CONFIGURATION FOR OPERATION IN THE MICROWAVE BAND

BACKGROUND OF THE INVENTION

The invention relates to a transistor oscillator for operation in the microwave band utilizing a basic CLAPP-circuit configuration, which involves a capacitive Hartley three-point circuit having a capacitance disposed in series with the circuit inductance. See for example FIG. 1.

Of the oscillator circuits commonly employed in microwave technology, the CLAPP oscillator offers the best possibilities for a wide-band frequency variation as the circuit inductance $L_S$ can be compensated by the reactance of the series capacitance $C_S$. With such circuit, the highest oscillating frequency is determined from the value of the collector-base capacitance $C_{CB}$ and of the smallest circuit inductance. The feedback network comprises the capacitive voltage divider between collector and emitter as well as between emitter and base. With higher frequencies the parasitic emitter-base capacitance $C_{CE}$ and emitter-base capacitance $C_{EB}$ can be advantageously utilized as capacitive voltage dividers for the feedback network.

BRIEF SUMMARY OF THE INVENTION

The invention has as its primary objective, the production of a simple and mechanically stable structure for a wideband-variable transistor oscillator of this type. In particular, such a structure should be readily produceable in stripline technology with a minimum of component elements, and requiring a minimum of test operations thereon to reduce test department expense to a minimum.

This objective is accomplished in the present invention in a transistor oscillator of the type referred to, wherein, in addition to the collector-base capacitance, a small capacitance is connected in series therewith which extends between base and ground, whereby the additional capacitance may comprise a line, having an electrical length of less than λ/4, and open at the end thereof, or is formed by a trimming capacitor or a varactor element.

A transistor oscillator of this type advantageously may be constructed in stripline technology, in which the high frequency filter chokes are produced by line sections of a length λ/4, whose ends are short-circuited over blocking capacitors.

As a result of the series connection of the collector-base capacitance with an additional small capacitance between base and ground, the effective capacitance is decreased. Consequently, high oscillating frequencies can be achieved and at the same time, by variation in the additional capacitance, the band width (which is variable by means of the circuit capacitance) can be shifted. Also, as a result of the insertion of the additional capacitance, a conductive grounding of the base, appropriate in high frequency design, is eliminated thus eliminating the occurrence of parasitic inductances which generally arise in connection with such a grounded circuit. As a result, the invention enables the production of an oscillator circuit of extremely simple structure with few component elements, which circuit is relatively insensitive to parasitic influences. Further, the invention enables the production of capacitors with definite output line values and variable band width without requiring subsequent adjustment (balancing, tuning, calibrating, etc.) operations.

In addition, from the different possibilities of influence upon the oscillating frequency, a number of other variations in the basic circuit may be derived therefrom.

BRIEF DESCRIPTION OF THE DRAWINGS

In the drawings wherein like reference characters indicate like or corresponding parts.

DETAILED DESCRIPTION OF THE INVENTION

Figure 1:
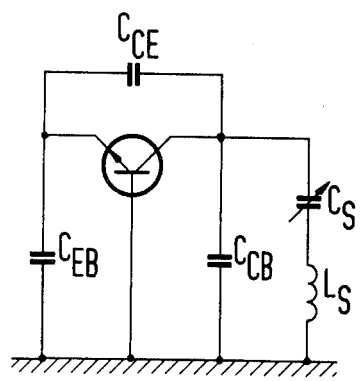
FIG. 1 illustrates a known CLAPP oscillator.

The CLAPP oscillator, in accordance with the prior art, illustrated in FIG. 1, may be constructed in anode-base circuit or collector-base circuit. As with the Colpitts oscillator, the CLAPP oscillator also involves a capacitive Hartley 3-point circuit, whose divider circuit is formed by the collector-emitter capacitance $C_{CE}$ and the emitter base capacitance $C_{EB}$. However, in contrast to the Colpitts oscillator, a capacitance $C_S$ is also connected in series with the oscillating inductance $L_S$.

Figure 2:
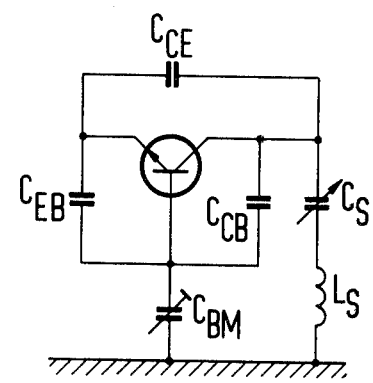
FIG. 2 is a circuit of a CLAPP oscillator in accordance with the present invention.

Proceeding from this known CLAPP oscillator, there is, in accordance with the invention, as illustrated in FIG. 2, an additional small capacitance $C_{BM}$ connected in series with the collector-base capacitance, with such small capacitance being disposed between the base of the transistor and ground. As a result of the series connection of the collector-base capacitance $C_{CB}$ with the additional small capacitance $C_{BM}$ disposed between the base and ground, the effective circuit capacitance is reduced and thus is operative to provide an increase in the oscillating frequency. In addition, as a result of the insertion of the series capacitance $C_{BM}$, a conductive grounding of the base is eliminated, thus eliminating parasitic inductances that in general occur from such a grounding connection.

Figure 3:
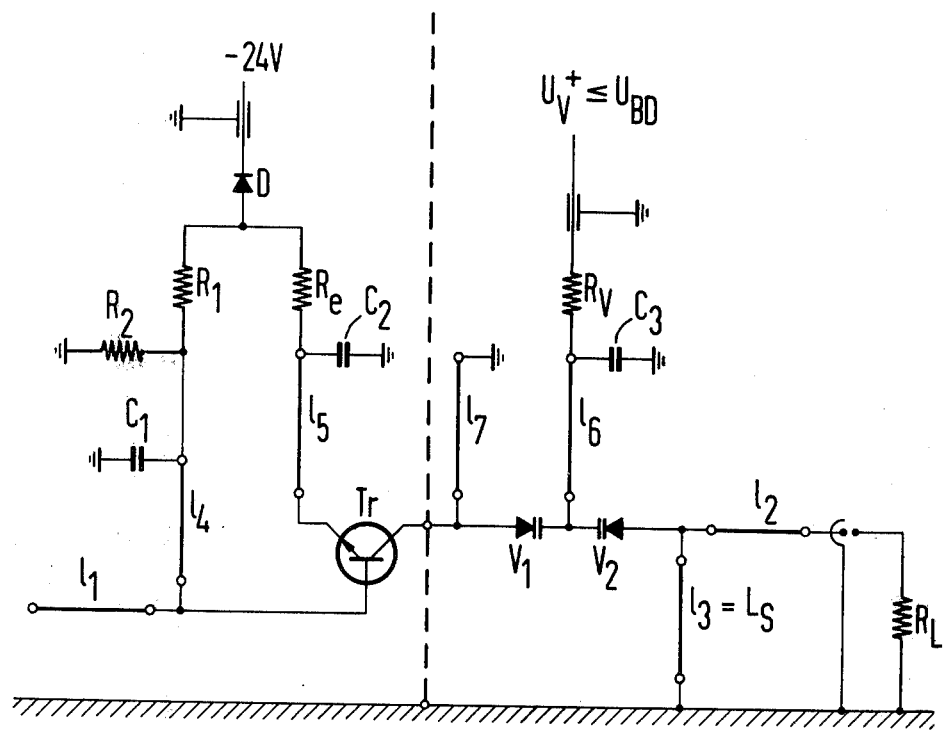
FIG. 3 illustrates a complete circuit diagram of an oscillator in accordance with the invention.

A complete circuit diagram of an oscillator in accordance with the present invention is illustrated in FIG. 3 in which the microwave portion of the circuit comprises line elements or sections $l_1$, $l_2$ and $l_3$ varactor diodes V1 and V2, by means of which an electronic frequency variation may be effected, and the microwave transistor $Tr$. The line section $l_1$ forms the additional capacitance $C_{BM}$, having one of its ends connected with the base of the microwave transistor $Tr$. Connected to the collector of such transistor are two series-connected, oppositely-poled varactor diodes V1 and V2, to which in the longitudinal branch, the line section $l_2$ is connected and in the transverse branch of which the line section $l_3$ is disposed, with the latter forming the oscillating inductance $L_S$. The direct current portion of the circuit includes a diode D which protects against the possibility of a polarity reversal, an emitter resistance $R_e$, a base voltage divider $R_1$, $R_2$, the varactor resistance $R_V$ and blocking capacitors $C_1$, $C_2$ and $C_3$. All direct currents and the varactor voltage are supplied over high ohmic line sections $l_4$, $l_5$ and $l_6$, each of which is λ/4 in length. The line section $l_7$ functions as a direct current return for the collector of the microwave transistor Tr and the varactor diode V1. The section $l_7$ is a line section, short-circuited at the end, having a length of λ/4.

This electrical structure may be produced by means of a relatively simple mechanical structure, with the circuit being realized with a minimum of component elements, in stripline technology, on a synthetic material or a ceramic substrate and enables various types of transistors to be utilized.

Figure 4:
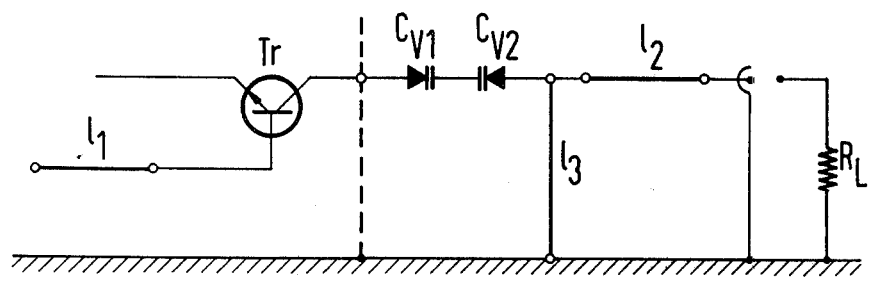
FIG. 4 illustrates the microwave portion of the oscillator of FIG. 3.
Figure 5:
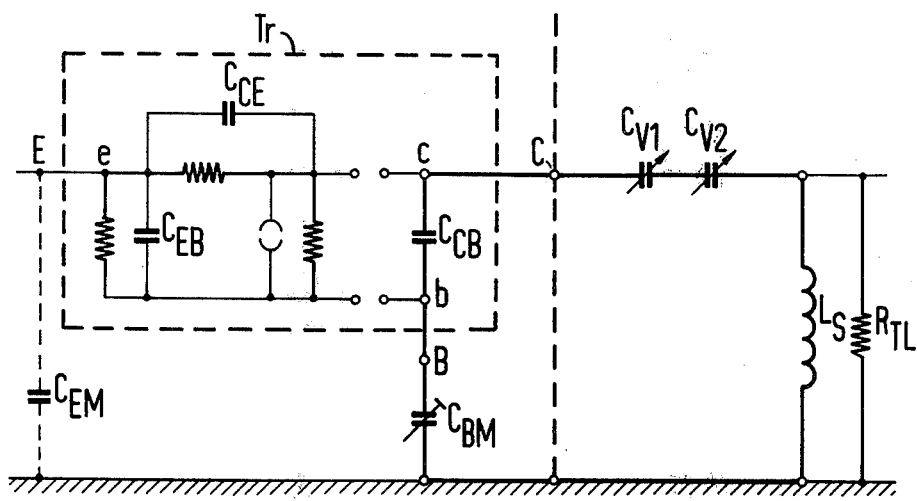
FIG. 5 is a substitute circuit diagram of the microwave portion illustrated in FIG. 4.

FIG. 4 illustrates a circuit diagram, similar to FIG. 3 but in which only the microwave portion of the oscillator is illustrated. For functional clarity, the parasitic influences of the direct-current feed-lines of a length of λ/4, on the oscillating frequencies, which such influences are conditioned by the short circuit idling transformation, have been omitted in the electrical substitute circuit diagram illustrated. The circuit diagram illustrated thus contains substantially only the frequency determining elements which will be described in greater detail in connection with the substitute circuit diagram of FIG. 5, in which the elements of the transistor Tr are enclosed within a broken line. Here, the barrier layer capacitance between collector and base is designated by the reference character $C_{CB}$, the additional capacitance between base and ground (for $l_1$ smaller than λ/4) with the reference character $C_{BM}$, the oscillating inductance (short-circuited line element portion $l_3$ smaller than λ/4) by $L_S$, the varactor capacitances, which form the oscillating capacitance $C_S$ of FIGS. 1 and 2, by the reference characters $C_{V1}$ and $C_{V2}$, the microwave transistor by Tr, the feedback voltage divider by the reference character $C_{CE}$ and $C_{EB}$, while the undesired stray capacity (spurious capacity, leakage inductance) between emitter and ground is designated as $C_{EM}$. The resistance $R_{TL}$ is the load $R_L$ transformed as a high resistance by the line section $l_2$. It will be appreciated that in the dimensioning of the oscillatory circuit, consideration must be given to the fact that the circuit portion represented in the figure, to the left of the vertical broken dividing line, remains capacitive in the desired frequency range, while the portion to the right of the dividing line remains inductive.

Of the frequency determining elements of the circuit, the capacitive reactance comprises the barrier layer capacitance $C_{CB}$ and an additional capacitance $C_{BM}$ arising from the capacitive properties of the line $l_1$, which is open at the end. The capacitance $C_{BM}$ thus is adjustable by means of an alteration in the length of the line section $l_1$ and can be replaced by the other capacitive elements such as trimmers or varactor diodes. The inductive reactance is formed from the sum of the positive reactance of the oscillating inductance $L_S$ and the negative reactance of the varactor elements $C_{V1}$ and $C_{V2}$. Thus, by altering the capacitances $C_{V1}$ and $C_{V2}$, connected in series, the adjustment of the inductive reactance can be effected over a large frequency band, which inductive reactance quantitatively is equal to the capacitive reactance of the circuit. The oscillator circuit inductance $L_S$ comprises the line section $l_3$ and a short-circuit contact, for example a screw which leads to ground. The detuning of the oscillatory circuit by means of compensation of the inductive reactance makes possible a wide variation of the oscillating frequency. It will be appreciated that the capacitances $C_{V1}$ and $C_{V2}$ can be replaced by other capacitive elements.

From the substitute circuit diagram of the oscillator a series of modified microwave transmitter circuits of various properties can be derived with some of such variations being illustrated in FIGS. 6–12.

Figure 6:
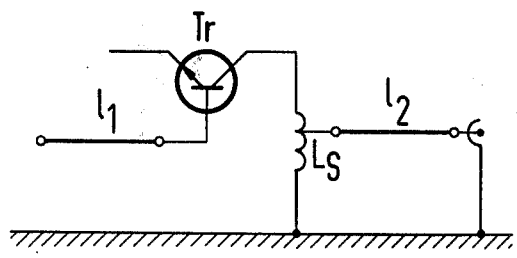
FIGS. 6–12 illustrate various modifications of the basic circuit illustrated in FIG. 2.

FIG. 6 illustrates a spot frequency oscillator involving merely a single, one time frequency adjustment. In this oscillator the capacitances $C_{V1}$ and $C_{V2}$ are replaced by a short circuit. The coupling in of the load takes place over the tap of the oscillating inductance $L_S$, and the adjustment procedure comprises shortening the line element or section $l_1$ to achieve a shifting of the oscillating frequency to a higher value.

Figure 7:
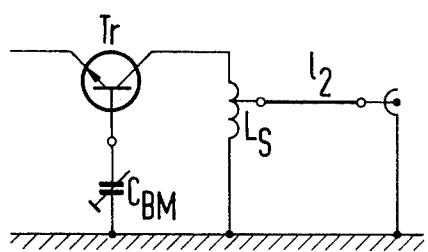
Figure 8:
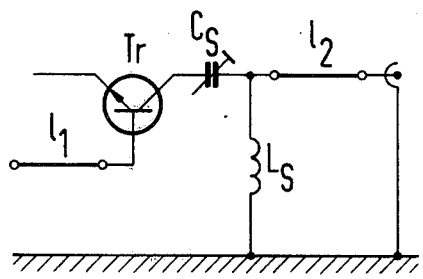
Figure 9:
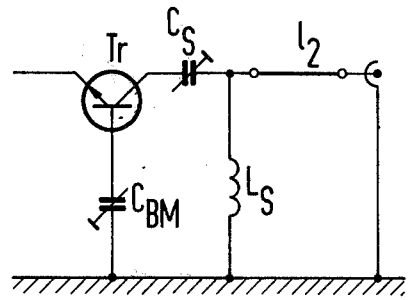

FIGS. 7, 8 and 9 each illustrate a spot frequency oscillator employing a frequency tuning by means of trimming capacitors. FIG. 7 illustrates an oscillator in which the additional capacitance $C_{BM}$ is a suitable trimmer element and the varactor capacitances $C_{V1}$ and $C_{V2}$ are bridged. Since the adjustment screw of the cylinder capacitor is grounded, the oscillator can be adjusted with the housing thereof in closed position.

In the oscillator circuit of FIG. 8, the additional capacitance $C_{BM}$ is formed by the line section $l_1$, and the varactor capacitances $C_{V1}$ and $C_{V2}$ are replaced by a trimming capacitor $C_S$.

With the trimming capacitance $C_S$ adjusted to maximum capacity, the lower oscillating frequency can be determined by means of a cutting operation on the line section $l_1$ to reduce the length thereof.

In the oscillator circuit of FIG. 9, the additional capacitance $C_{BM}$ and the oscillating capacitance $C_S$ are both formed by trimming capacitor elements. This arrangement makes possible a very wide mechanical band variation, since not only the circuit capacitance but also the circuit inductance are altered.

Figure 10:
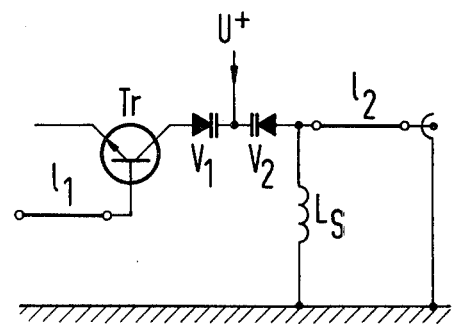
Figure 11:
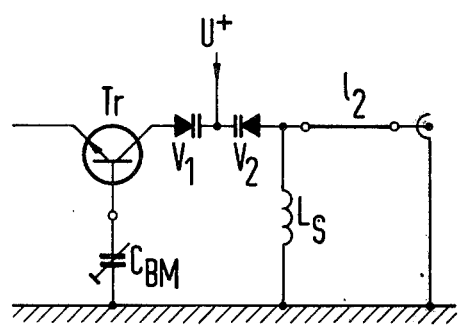
Figure 12:
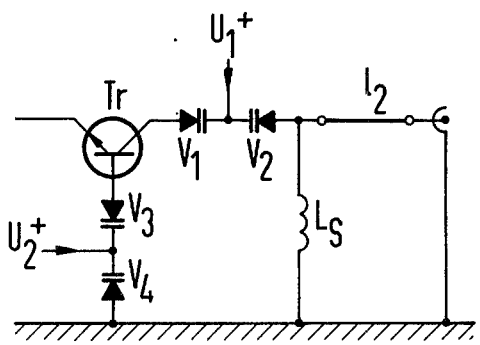

FIGS. 10, 11 and 12 illustrate electronically variable oscillators. FIG. 10 illustrates an electronically variable oscillator having an adjustable initial frequency in which the electronic variation is achieved by compensation of the inductive reactance of the oscillating inductance $L_S$ with one or more series-connected varactor elements $V_1$ and $V_2$. The lower oscillating frequency or initial frequency can be adjusted by shortening the line section $l_1$.

FIG. 11 illustrates an electronically variable oscillator with adjustable initial frequency in which the additional capacitance $C_{BM}$ is formed by a trimming capacitor instead of the line element $l_1$ illustrated in FIG. 10.

FIG. 12 illustrates an electronically variable oscillator with electronically adjustable initial frequency, in which both the oscillating capacitances and the additional capacitances comprise varactor elements $V_1$, $V_2$, and $V_3$, $V_4$. In this case, in the variation of the two pairs of varactor elements, the same grid potential (priming potential) can be employed, whereby, as a result of the simultaneous alteration of the circuit inductance and the circuit capacitance, a very wide band electronic variation can be achieved, or an individual grid potential (priming potential) can be used for the varactor elements forming the additional capacitance, whereby the lower oscillating frequency (initial frequency) can be electronically adjusted. The second oscillator variation thus possesses two independent frequency modulation inputs.

It will be appreciated that the additional capacitance $C_{BM}$, regardless of physical structure is on the order of the very small capacitances involved in microwave technique, as will be apparent from a reference to the circuits of FIGS. 3, 4, 6 and 10, involving line sections to form the additional capacitance. The term "small" capacitance is thus intended to define such a capacitance.

Having thus described my invention it will be obvious that although various minor modifications might be suggested by those versed in the art, it should be undertood that I wish to embody within the scope of the patent granted hereon all such modifications as reasonably, and properly come within the scope of my contribution to the art.

I claim as my invention:

1. In a transistor oscillator for the microwave band, utilizing CLAPP circuit configuration, the combination of a small capacitance in series with the collector-base capacitance and disposed between the base and ground, said additional capacitance comprising a line section open at the end, the electrical length of which line is smaller than $\lambda/4$.

2. In a transistor oscillator, constructed in strip-line technique, for the microwave range, utilizing CLAPP-circuit configuration, having a capacitive voltage divider comprising the collector-emitter capacitance and the emitter-base capacitance, and provided with an adjustable capacitance connected in series with the resonant circuit inductance in the collector circuit, with the collector-base capacitance forming a part of the capacitance reactance of the frequency-determining elements of the oscillator circuit, the combination of an additional small capacitance disposed between the transistor base and ground and connected in series with the collector-base capacitance, operative to reduce the effective circuit capacitance and thereby increase the oscillator frequency, and line sections of $\lambda/4$ in length forming the direct current feed to the transistor, of which the end connected to the voltage source is short-circuited over a blocking condensor.

3. A transistor oscillator according to claim 2, in which the alterable capacitance in the collector circuit is a voltage-dependent adjustable capacitance, wherein said voltage-dependent capacitance is connected to a direct current feed by line sections of $\lambda/4$ in length, of which the end connected to the voltage source is short-circuited over a blocking condensor.

4. A transistor oscillator according to claim 3, wherein one of said line sections of $\lambda/4$ in length is common to the direct current feed of both the transistor and the voltage-dependent capacitance.

5. A transistor oscillator according to claim 2, wherein the additional capacitance consists of a line section open at the end, the electrical length of which line is smaller than $\lambda/4$.

6. A transistor oscillator according to claim 5, in which the alterable capacitance in the collector circuit is a voltage-dependent adjustable capacitance, wherein said voltage-dependent capacitance is connected to a direct current feed by line sections of $\lambda/4$ in length, of which the end connected to the voltage source is short-circuited over a blocking condensor.

7. A transistor oscillator according to claim 6, wherein one of said line sections of $\lambda/4$ in length is common to the direct current feed of both the transistor and the voltage-dependent capacitance.

8. A transistor oscillator according to claim 2, wherein the additional capacitance comprises a trimming capacitor.

9. A transistor oscillator according to claim 2, wherein the additional capacitance is formed by varactor elements.

10. A transistor oscillator according to claim 9, in which the alterable capacitance in the collector-circuit is a voltage-dependent adjustable capacitance, wherein said voltage-dependent capacitance is connected to a direct current feed by line sections of $\lambda/4$ in length, of which the end connected to the voltage source is short-circuited over a blocking condensor.

11. A transistor oscillator according to claim 10, wherein one of said line sections of $\lambda/4$ in length is common to the direct current feed of both the transistor and the voltage-dependent capacitance.

* * * * *